United States Patent
Stoisiek et al.

(10) Patent No.: US 8,901,614 B2
(45) Date of Patent: Dec. 2, 2014

(54) LOCATION-RELATED ADJUSTMENT OF THE OPERATING TEMPERATURE DISTRIBUTION OR POWER DISTRIBUTION OF A SEMICONDUCTOR POWER COMPONENT, AND COMPONENT FOR CARRYING OUT SAID METHOD

(75) Inventors: Michael Stoisiek, Erlangen (DE); Michael Gross, Erlangen (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 550 days.

(21) Appl. No.: 12/990,569

(22) PCT Filed: May 19, 2009

(86) PCT No.: PCT/EP2009/056080
§ 371 (c)(1),
(2), (4) Date: Jan. 14, 2011

(87) PCT Pub. No.: WO2009/141350
PCT Pub. Date: Nov. 26, 2009

(65) Prior Publication Data
US 2011/0102059 A1 May 5, 2011

(30) Foreign Application Priority Data
May 19, 2008 (DE) .......... 10 2008 023 217

(51) Int. Cl.
| | |
|---|---|
| H01L 23/52 | (2006.01) |
| H01L 29/78 | (2006.01) |
| H01L 21/67 | (2006.01) |
| H01L 29/423 | (2006.01) |
| G05D 23/19 | (2006.01) |
| H03K 17/14 | (2006.01) |
| H03K 17/08 | (2006.01) |

(52) U.S. Cl.
CPC .......... *G05D 23/19* (2013.01); *H01L 29/7802* (2013.01); *H01L 21/67098* (2013.01); *H01L 29/4238* (2013.01); *H01L 29/7831* (2013.01); *H01L 21/67248* (2013.01); *H03K 17/145* (2013.01); *H01L 29/7816* (2013.01); *H03K 2017/0806* (2013.01)
USPC .......... 257/207; 257/202; 257/208; 257/210; 257/211; 257/341; 257/401; 257/E29.04; 438/587

(58) Field of Classification Search
USPC ......... 257/202, 207, 208, 210, 211, 341, 335, 257/401, E29.04; 438/587
See application file for complete search history.

(56) References Cited

U.S. PATENT DOCUMENTS

| | | | |
|---|---|---|---|
| 5,023,189 A | 6/1991 | Bartlow | |
| 5,355,008 A * | 10/1994 | Moyer et al. .................. | 257/341 |

(Continued)

FOREIGN PATENT DOCUMENTS

| | | |
|---|---|---|
| DE | 3831012 A1 | 3/1990 |
| DE | 19816806 A1 | 10/1999 |
| GB | 2322709 A | 9/1998 |

OTHER PUBLICATIONS

International Search Report—WO2009/141350; published Nov. 26, 2009.

(Continued)

*Primary Examiner* — Kenneth Parker
*Assistant Examiner* — John Lin
(74) *Attorney, Agent, or Firm* — Duane Morris LLP

(57) ABSTRACT

Described is a method for adjusting an operating temperature of MOS power components composed of a plurality of identical individual cells and a component for carrying out the method. As a characteristic feature, the gate electrode network (4) of the active chip region is subdivided into several gate electrode network sectors (B1, B2, B3) which are electrically isolated from one another by means of isolating points and to each of which a different gate voltage is fed via corresponding contacts.

7 Claims, 5 Drawing Sheets

(56) References Cited

U.S. PATENT DOCUMENTS 6,438,030 B1 * 8/2002 Hu et al. .................. 365/185.18
2003/0210507 A1 11/2003 Pihet et al.

OTHER PUBLICATIONS

"Dynamic Hot Spot Temperature Sensing in Smart Power Switches" by Michael Glavanovics and Heinz Zitta, Infineon Technologies, Microelectronic Design Center Villach, Austria, ESSCIRC 2002, pp. 295 to 298.

"Detection and Optimization of Temperature Distribution Across Large-Area Power MOSFETs to Improve Energy Capability", Vishnu Khemka, Member, IEEE, Vijay Parthasarathy, Ronghua Zhu, Amitava Bose, and Todd Roggenbauer, Member, IEEE Transactions on Electron Devices, vol. 51, No. 6, Jun. 2004, pp. 1025 to 1032.

"Aufbau- und Verbindungstechnik in der Leistungselektronik" by U. Scheuermann, Semikron International GmbH, Nuernberg, Kapitel 10, pp. 707 to 777, Editor Dierk Schroeder, Springer.

* cited by examiner

LOCATION-RELATED ADJUSTMENT OF THE OPERATING TEMPERATURE DISTRIBUTION OR POWER DISTRIBUTION OF A SEMICONDUCTOR POWER COMPONENT, AND COMPONENT FOR CARRYING OUT SAID METHOD

CROSS-REFERENCE TO RELATED PATENT APPLICATIONS

The present application is a U.S. national stage application under 35 U.S.C. §371 of PCT Application No. PCT/EP2009/056080, filed on May 19, 2009, the entirety of which is incorporated herein by reference.

The invention relates to a method for adjusting a distribution at a semiconductor power component, e.g. a MOS-power transistor or an IBGT, e.g. a power distribution or an operating temperature distribution as a function of location. The invention also relates to a component for performing the method.

It is desirable to operate semiconductor components close to an upper temperature limit defined by component reliability and component specification in a range of e.g. 150° C. to 200° C. depending on the component type and development stage. The heat generated during operations through the converted electrical power dissipation has to be removed. Operations at the upper temperature limit, which is predetermined in principle by the component configuration, and maintaining the upper temperature limit typically is only partially possible, since based on inhomogeneous heat conduction properties and/or an inhomogeneous electrical control of the component, an inhomogeneous temperature distribution is created over the component surface with local temperature peaks, so-called hotspots. Under some conditions, the temperature of the hotspots can increase out of control until the component is destroyed due to the thermal/electrical coupling. The thermal load limit is particularly important for a periodical or one time operation of the component proximal to the electrical and thermal load limits, like e.g. the unclamped switch-off of an inductive load (without unloading network) or switching off the component after a short circuit of the load has occurred.

In order to solve the problem of safe component operation and in order to prevent destruction there are various methods.

One method includes precalculating and/or directly measuring the temperature development as a function of the dissipated power loss and defining a transient thermal resistance by means of which the chip temperatures occurring in the actual range can be computed. Since this is typically a value relating to the entire component chip surface, different temperatures within the component chip surface cannot be described, and in particular hotspots cannot be prevented from occurring.

Another option includes measuring the temperature occurring during the operation of the component through a temperature sensor which is integrated into the component or the direct proximity of the component in particular for this purpose, wherein the temperature sensor is e.g. a pn-junction operated in pass-through direction, which can be derived from V. Khemka et al., "Detection and Optimization of Temperature Distribution Across Large Area Power MOSFETs to improve Energy Capability", IEEE Transactions on Electron Devices, Vol. 51, No. 6, 1025-1032, 2004, as well as from M. Glavanovics and H. Zitta, "Dynamic Hotspot Temperature Sensing in Smart Power Switches", ESSCIRC 2002, 295-298, 2002.

It is a disadvantage of the method that the temperature can only be measured respectively at a location of a sensor and the number of the sensors to be integrated is limited due to their chip surface usage. Furthermore, there is a minimum distance between the temperature sensor and the adjacent active component portion, wherein the minimum distance is caused by the design, which causes the temperature measured at the location of the sensor and the temperature in the adjacent active chip portion to deviate from one another and allows measuring a time-based change of the temperature of the active chip portion only with a considerable delay at the sensor.

In many cases, in particular when the active component portion is surrounded by an electrically inactive chip portion, which, however, contributes to heat dissipation, hotspots are created, which are centered in the center of the surface of the component. It is a known method for avoiding these hotspots to provide the active cells disposed in the center of the component, e.g. of a vertical power-MOSFET, based on their layout with a larger switch-on resistance than cells of the peripheral chip portions as known from V. Khemka et al., "Detection and Optimization of Temperature Distribution Across Large Area Power MOSFETs to improve Energy Capability", IEEE Transactions on Electron Devices, Vol. 51, No. 5, 1025-1032, 2004. Thus, a particular value is predetermined by the design, wherein also particular safety limits need to be maintained, which also leads to particular power reductions and does not include any control capability.

It is the purpose of the invention to improve the temperature distribution on the semiconductor chip surface during operation of the MOS-controlled semiconductor component, and thus to avoid the disadvantages of the prior art.

It is an object of the invention to provide an electrical method for adjusting the operating temperature of a semiconductor component as function of location and to provide a component for performing the method, which leads to an improved operating temperature distribution of the component without changing the layout of the component chip as a function of location.

The object is achieved through the method according to the invention for adjusting the operating temperature of a semiconductor power element as a function of location, wherein the power component is made from a plurality of particular cells that have identical functions, wherein the gate electrode network of the active chip area is divided into plural portions, electrically isolated relative to one another through isolating points, wherein the portions are respectively associated with a particular active portion of the chip, and wherein different gate voltages can be applied to the different portions of the gate electrode network through contact points provided at the portions of the gate electrode network.

The power distribution over the chip surface is controlled through different gate voltages which are supplied to the different sections of the gate electrode network, which are isolated relative to one another. The dissipated power which causes a temperature change can be considered as power. The power distribution determines the temperature distribution. The isolated gates facilitate controlling one or the other, or indirectly one through the other.

Thus, it is advantageous when the contact points of the portions of the gate electrode network which are electrically insulated by the isolating points, are respectively connected in pairs with contacts for the gate electrode.

Thus, it is furthermore advantageous when the portions of the gate electrode network of the active chip area is divided into plural concentric electrically isolated portions and an outer portion of the gate electrode network is connected to a contact through a contact point.

Thus, it is furthermore advantageous when the portions of the gate electrode network are distributed over the component surface, so that an association of the temperature distribution with particular surface portions of the total surface of the component is provided.

Thus, it is furthermore advantageous when the portions of the gate electrode network with their contacts are distributed over the active chip surface according to a particular system.

Thus, it is furthermore advantageous when the temperature of particular surface portions of the total component surface is controllable through a dissipated power which is generated by the gate voltage.

Thus, it is furthermore advantageous when the contact points of a pair of contact points have a particular distance from one another which defines the power or dissipated power generated by the gate voltage.

Thus, it is furthermore advantageous when the gate electrode is substantially only thermally coupled through a thin gate oxide to a silicon disposed there under, wherein the temperature of the silicon disposed there under is defined by the dissipated power "generated" by the gate voltage.

The object is achieved through the semiconductor component according to the invention for adjusting the operating temperature as a function of a location on the active chip surface, wherein the semiconductor power component includes a plurality of identical components, wherein the gate electrode network of the active chip area is divided into plural portions respectively electrically isolated from one another through isolating points, wherein the portions are associated respectively with a particular active portion of the chip, and wherein contact points are provided at the portions of the gate electrode network, through which contact points different gate voltages can be applied to the portions of the gate electrode network.

Thus, it is advantageous when the contact points of the portions of the gate electrode network electrically isolated by the isolating points are respectively connected in pairs with contacts for the gate electrode.

Thus, it is furthermore advantageous when the active chip area is divided into plural concentric electrically insulated portions and when an outer portion of the gate electrode network is connected with a contact through a contact point.

Thus, it is furthermore advantageous when the portions of the gate electrode network are distributed over the component surface, so that an association of the temperature distribution with particular surface portions of the total element surface is provided.

Thus, it is furthermore advantageous when the portions of the gate electrode network with their contacts are distributed over the active chip surface according to a particular system.

Thus, it is furthermore advantageous when the contact points of a contact pair have a particular distance from one another which defines the power or dissipated power generated by the gate voltage.

Thus, it is furthermore advantageous when the gate electrode is substantially only thermally coupled through a silicon disposed there under through a thin gate oxide, wherein the temperature of a silicon disposed there under is to be defined through the dissipated power generated by the gate voltage.

Thus, it is furthermore advantageous when the plural single cells form a real non-overlapping subgroup of the plurality for each of the portions.

Thus, it is furthermore advantageous when the gate electrode has fingers, which extend in one direction and wherein the electrically isolating points extend transversal to the extension of the fingers of the gate electrode.

The invention relates in particular to components which include a plurality of identical and parallel connected discrete cells in which the total component surface is large compared to the surface of the discrete cell and in which the gate electrode or the gate electrode network can be separated into components electrically isolated from one another, wherein the respective component is provided with additional contacts of the gate electrode for performing the method.

The invention furthermore relates to semiconductor components with vertical current flow through the semiconductor chip and also to components for integrating a so-called smart power IC with a lateral flow of the main current, and the invention is being used in components made from semiconductor silicon, but also from other semiconductor materials, e.g. silicon carbide (SIC).

The embodiments of the invention have the advantages that the operating temperature in various chip portions electrically separated from one another can be adjusted through a respectively adapted gate voltage in order to, on the one hand, prevent particular component portions from overheating and, on the other hand, to compensate for stronger operating temperature reductions in other component portions. Thus, the power of the components can be increased and its reliability can be improved.

The gate electrode network typically only provided with one contact is provided with plural gate contacts associated with areas of the component chip associated with different temperature settings, wherein the gate electrode network is divided into segments isolated from one another. Thus, the segments can be provided with respective gate voltages independently from one another and a generation of dissipated power which differs from segment to segment can be achieved for obtaining an improved temperature distribution.

Positioning additional gate contacts provides substantial flexibility with respect to extension and position of the component portion covered for temperature adjustment. Contacts disposed far apart facilitate adjusting the mean temperature of selected surface segments of the component, e.g. the temperature in concentric annular segments of the component surface. Furthermore, gate contacts disposed in close proximity to one another facilitate adjusting the temperature with high location resolution.

The invention is now described based on exemplary embodiments with reference to schematic drawing figures, wherein.

Figure 1:
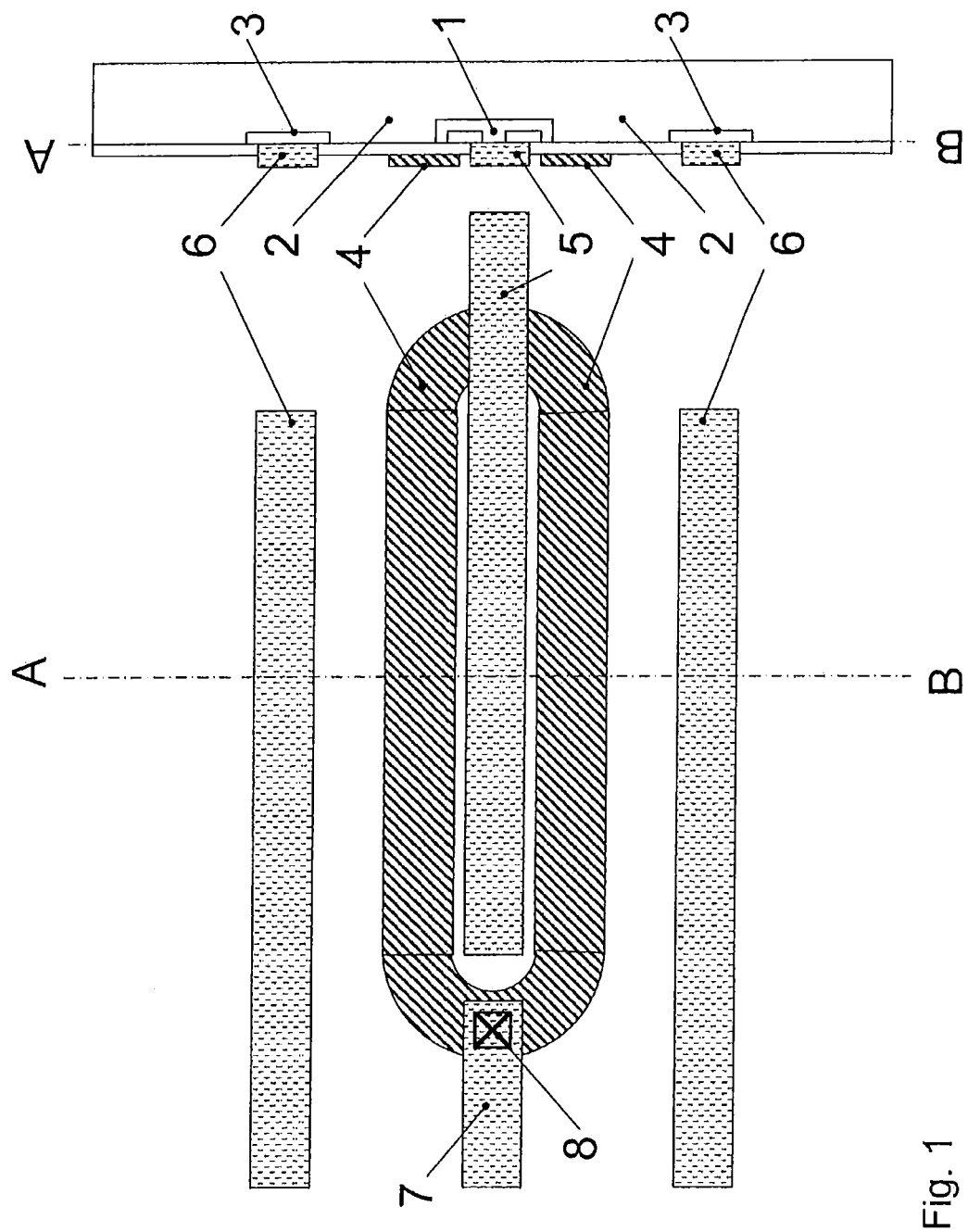
FIG. 1 illustrates a top view and a sectional view of a conventional single finger MOS transistor.

FIG. 1 illustrates a top view and sectional view of a conventional elongated single finger MOS transistor with a source body complex 1 disposed in the center, and two drift zones and drain portions 2, 3 disposed symmetrical thereto. The one finger MOS transistor with respect to its basic configuration corresponds to a discrete cell with a large area MOS power component configured from plural discrete cells.

In a schematic embodiment of FIG. 1, the gate electrode configured as an elongated ring 4 with metallic conductive paths 5, 6 for contacting the source portion in the source body complex 1 or the drain portions 3 and a metallic conductor 7 for contacting the gate electrode 4 are drawn. FIG. 1 furthermore illustrates typical doting zones and material layer sequences along a section A-B.

Figure 2:
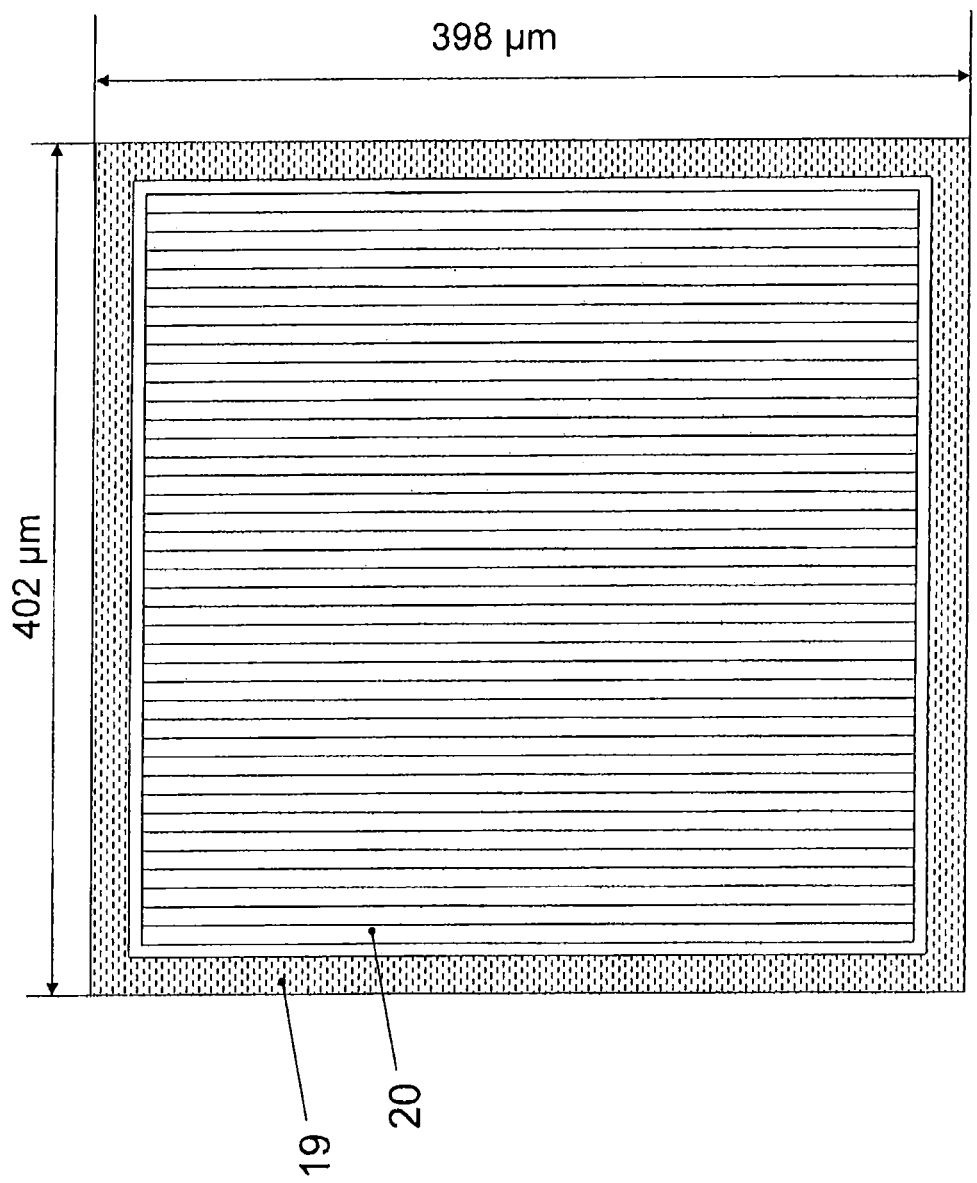
FIG. 2 illustrates a top view of a MOS transistor according to an embodiment of the invention with a symbolic gate network which is configured according to FIG. 3.

FIG. 2 illustrates a configuration according to the invention of a large surface MOS power transistor with a real surface area of approximately 0.4 mm×0.4 mm, wherein the large surface MOS power transistor includes a plurality of identical discrete cells which are vertically arranged adjacent to one another and finger shaped as illustrated in FIG. 1. The transistor chip is square with an edge length of approximately 0.4 mm. The edge zone is 19. The active inner portion is covered with a large number of finger shaped discrete cells 20 according to FIG. 1 with a modification according to FIG. 3.

Figure 3:
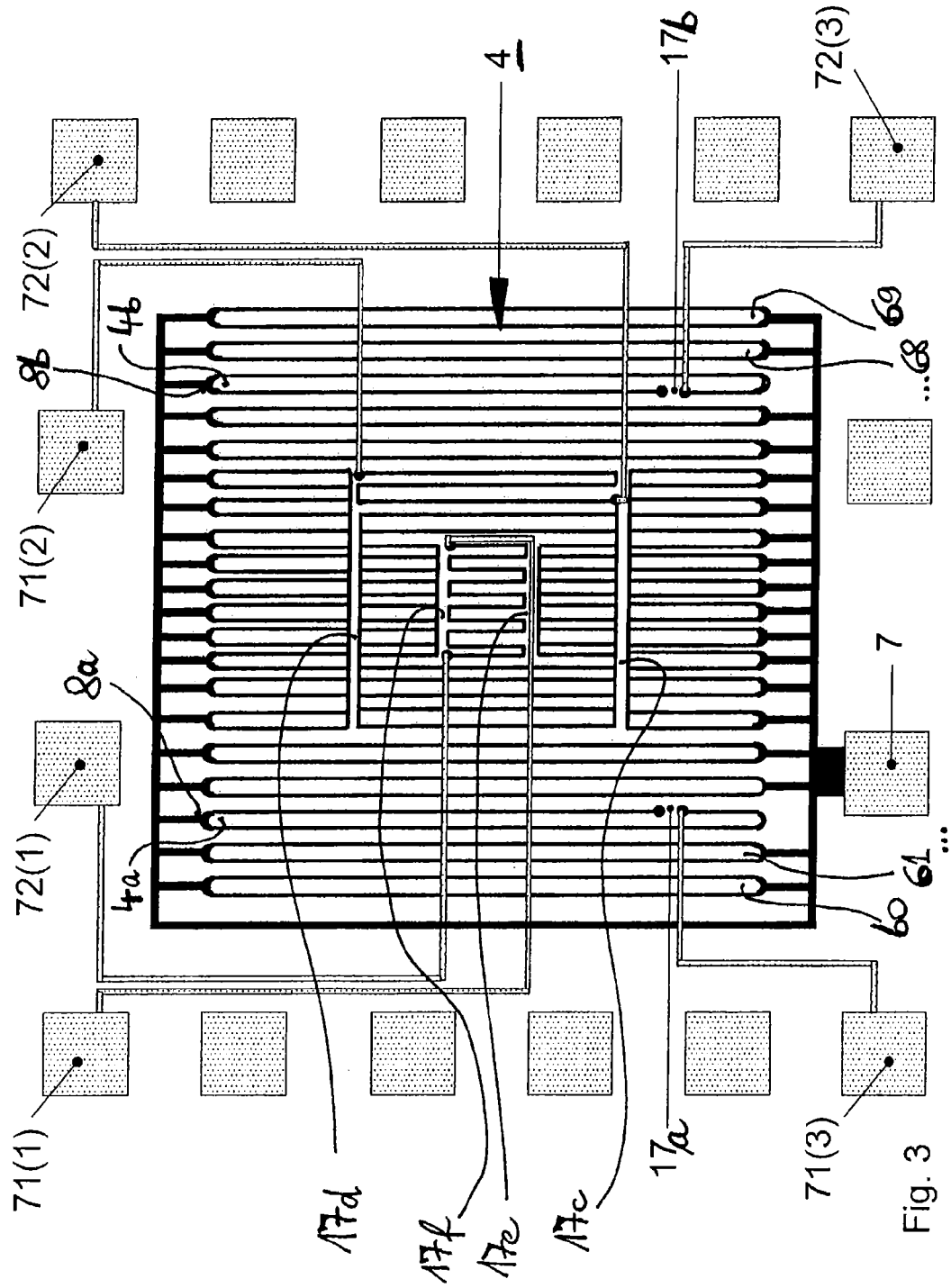
FIG. 3 illustrates the system of the gate connections of a MOS transistor according to the invention with a basic structure comparable to FIG. 1.

The gate electrode paths of the gate electrode 4 disposed adjacent to one another of the gate electrode network are divided according to the scheme of FIG. 3 through electrical isolating points 17c, 17d, 17e, 17f into partial portions B1, B2, B3 isolated relative to one another, wherein the partial portions have separate gate contacts.

Figure 4:
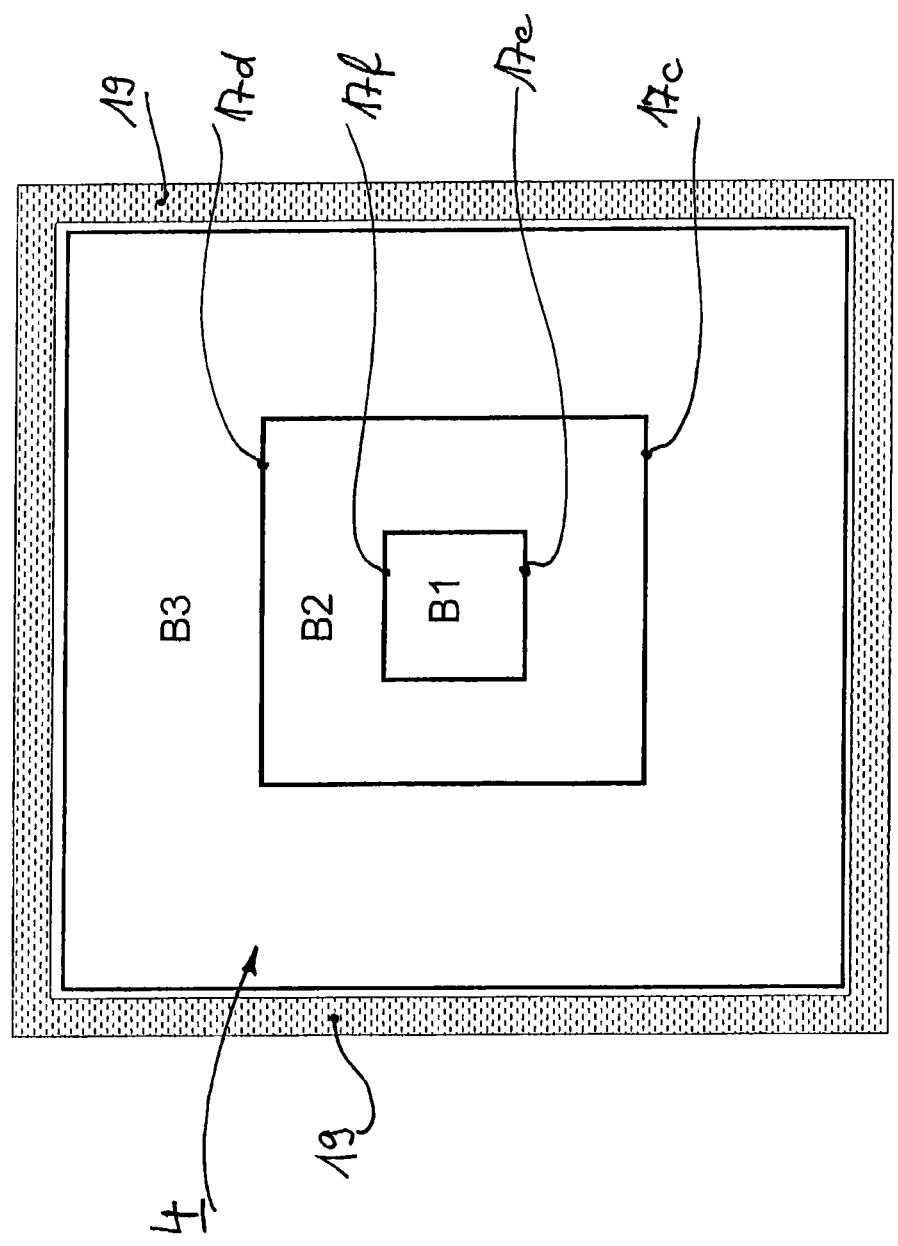
FIG. 4 illustrates a division of the MOS transistor illustrated in FIG. 3 into three portions disposed concentric to one another.

The separation of the gate electrode into the partial portions B1, B2, B3 with their connections is based on a division of the component surface into three concentric portions according to FIG. 3 and FIG. 4, which can be separately provided with different gate voltages through the additional gate contacts with respect to temperature distribution.

The portion of the gate electrode in the outer portion B3 (from FIG. 4) is connected to a common gate contact 7. The additional contact point pairs for the gate electrode 71(1)/72(1); 71(2)/72(2) are used for electrical supply for the gate voltage which can be different as a function of the partial portion of the electrode network. The gate electrodes in the portion B2 are contacted by two gate contacts 71(2) and 72(2), so that they can be controlled separately from the gate electrodes in the portion B3 and in the portion B1. The gate electrodes in the portion B1 are connected with the contacts 71(1)/72(1) and facilitate applying a gate voltage which is independent from the partial portions B2 and B3.

Through dividing the gate electrode with its connections, respective different gate voltages and thus the dissipated power per portion can be adjusted, so that approximately the same temperature is reached everywhere.

The embodiment illustrated in FIG. 3 is characterized in that the component surface is covered by finger shaped parallel discrete cells and the gate electrode network is made from strips disposed adjacent to one another or elongated annular paths, this means fingers 60-69.

The isolating points 17a, 17b at the gate electrode paths 4a and 4b and the contacting of the gate electrode paths 4a, 4b only at the contact locations 8a, 8b at their upper ends (viewing direction like in FIG. 3) is used for measuring the resistance of the electrode path between the contact 71(3) and the contact 7 or between the contact 71(3) and the contact 7 or between the contact 71(3) and the contact 72(3) for determining the temperature of the chip in the respective portion (as a measurement path).

Figure 5:
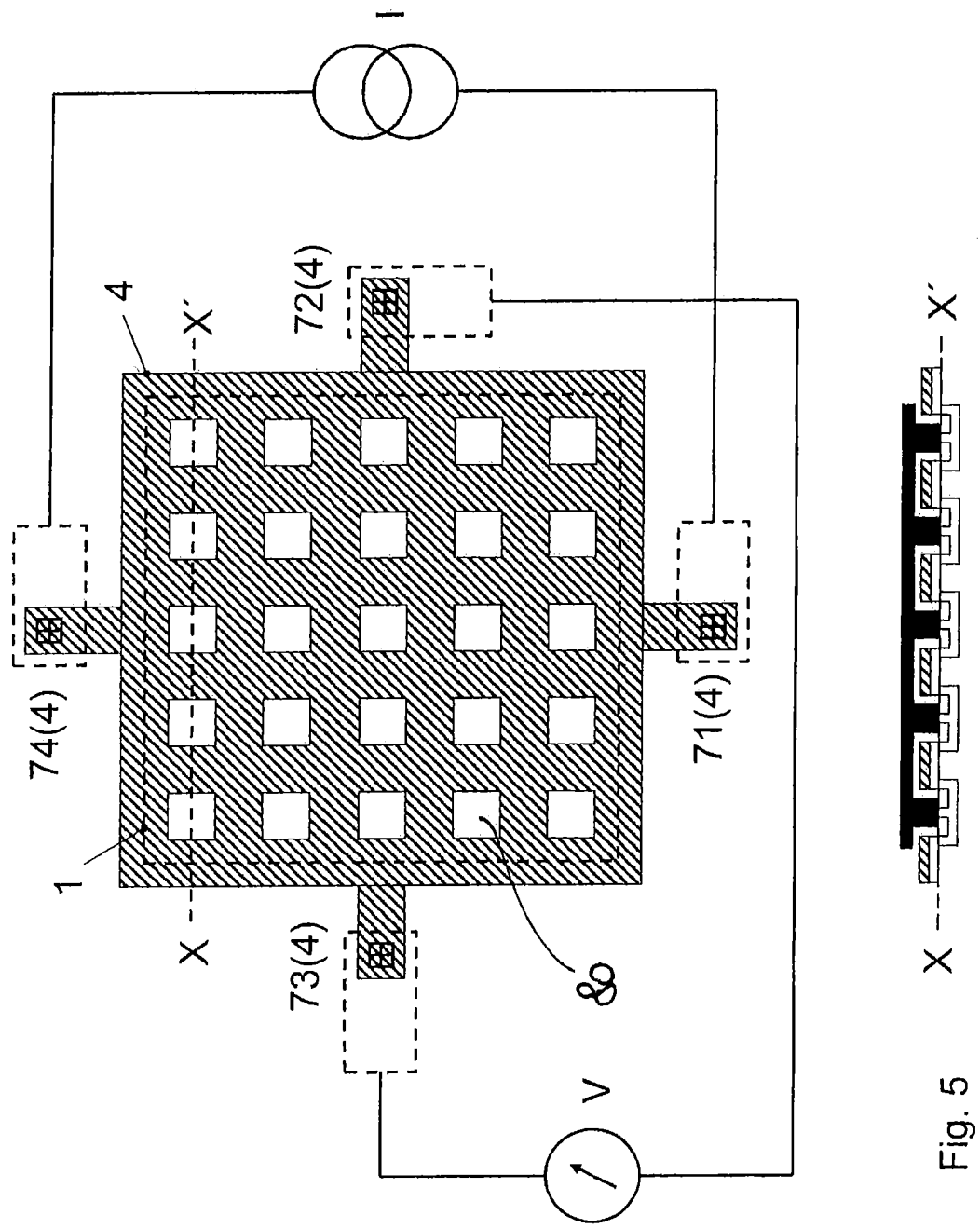
FIG. 5 illustrates a top view and a sectional view of a MOS transistor with square discrete cells.

In principle also transistor topologies are feasible, in particular for discrete transistors with vertical current flow, in which the active component surface is provided with a plurality of square or hexagonal discrete cells. FIG. 5 illustrates an embodiment of a transistor topology of this type.

The gate electrode 4 in this case has the structure of a plate extending over the entire component surface, in which respective recesses 80 are provided in a center of periodically repeated base cells. The gate electrode 4 is fed by a power source 1 through contacts 71(4), 74(4) and a temperature based resistance of the gate electrode 4 is measured through measuring the voltage at the measurement contacts 72(4), 73(4) in order to determine the temperature at the gate electrode 4 from the measured resistance value.

Also here, it is possible to balance the operating temperature in particular portions through additional contacts and providing isolated portions of the gate electrode 4. For localized operating temperature adjustment, the entire active component surface is divided into segments again in turn, whose gate electrode networks are isolated from one another through accordingly configured electrical isolating points, as illustrated in FIG. 3.

Thus, a method for adjusting the operating temperature of semiconductor components which are configured from a plurality of identical discrete cells and a component for performing the method are described. Dividing the gate electrode network of the active chip portion into plural gate electrode network portions electrically isolated from one another through isolating points characterizes the invention, wherein the isolated gate electrode network portions are respectively provided with a different gate voltage through respective contacts.

The invention claimed is:

1. A method for adjusting a locally distributed operating temperature of a MOS power component having different temperatures across the MOS power component, wherein the MOS power component includes a common drain, a common source and a plurality of functionally identical, discrete cells, and having a gate electrode network (4) distributed over an active chip area of the MOS power component, the network being separated into plural gate portions that are electrically isolated relative to one another by isolating portions, wherein each electrically isolated gate portion is associated with a corresponding active portion of the active chip area, and wherein a contact zone of each gate portion of the gate electrode network (4) is supplied with a different gate voltage whereby the different gate portions of the gate electrode network (4) actively adjust corresponding different currents through different active portions of the active chip area.

2. The method according to claim 1, wherein the contact zones of the isolated portions of the gate electrode network are connected in pairs with contacts to form the gate electrode network.

3. The method according to claim 1, wherein the gate electrode network of the active chip area is separated into plural concentric electrically isolated portions and an outer portion (B3) of the gate electrode network is connected with a contact pad.

4. The method according to claim 1, wherein the separated gate portions of the gate electrode network are distributed over a surface of a power component surface, providing an association of the temperature distribution with particular surface portions of the surface of the power component.

5. The method according to claim 1, wherein a temperature of a surface portion of a power component surface is controlled by a power or dissipated power controlled by an individual gate voltage of the corresponding gate portion.

6. The method according to claim 5, wherein associated contact pads of a contact pair have a distance from one another, determining the power or dissipated power controlled by the gate between the contact pair of contact pads.

7. The method according to claim 1, wherein the gate electrode network is thermally coupled by a thin gate oxide to a silicon active chip area disposed thereunder, wherein a temperature of a silicon portion of the silicon active chip area disposed below a gate portion is determined by the power or dissipated power controlled by the gate voltage of the associated gate portion.

\* \* \* \* \*